United States Patent [19]

Fatcheric et al.

[11] Patent Number: 5,679,230

[45] Date of Patent: Oct. 21, 1997

[54] COPPER FOIL FOR PRINTED CIRCUIT BOARDS

[75] Inventors: John Francis Fatcheric, Lugoff, S.C.; Derek Charles Carbin, Bennington, Vt.

[73] Assignee: Oak-Mitsui, Inc., Hoosick Falls, N.Y.

[21] Appl. No.: 517,321

[22] Filed: Aug. 21, 1995

[51] Int. Cl.$^6$ .............................. C25D 7/06; B32B 15/20
[52] U.S. Cl. ............................. 205/50; 205/125
[58] Field of Search ............................. 205/50, 125, 169

[56] References Cited

U.S. PATENT DOCUMENTS

| | | | |
|---|---|---|---|
| 3,220,897 | 11/1965 | Conley et al. | 148/34 |
| 3,293,109 | 12/1966 | Luce et al. | 161/166 |
| 3,585,010 | 6/1971 | Luce et al. | 29/191.2 |
| 3,857,681 | 12/1974 | Yates et al. | 29/195 |
| 3,918,926 | 11/1975 | Wolski et al. | 29/195 |
| 4,997,516 | 3/1991 | Adler | 156/630 |
| 5,057,193 | 10/1991 | Lin et al. | 204/27 |
| 5,437,914 | 8/1995 | Saida et al. | 428/209 |
| 5,482,784 | 1/1996 | Ohara et al. | 428/607 |

FOREIGN PATENT DOCUMENTS

WO 94/21097  10/1994  WIPO.

*Primary Examiner*—John Niebling
*Assistant Examiner*—Alex Noguerola
*Attorney, Agent, or Firm*—Harold N. Wells; Roger H. Criss; Kyle K. Kappes

[57] ABSTRACT

A electrolytically deposited copper foil has a roughening treatment of copper on the shiny side and on the matte side a fine nodular metal deposit preferably copper or a copper alloy which improves adhesion to a substrate, but is insufficient to increase the measured surface roughness Rz.

18 Claims, 2 Drawing Sheets

COPPER FOIL FOR PRINTED CIRCUIT BOARDS

BACKGROUND OF THE INVENTION

This invention relates to the thin copper foils used to make printed circuit boards. In particular, it relates to a copper foil which can be used to make multilayer circuit boards without requiring the conventional black oxide treatment to improve adhesion.

Copper foils are conventionally produced by electrodepositing copper from solution onto a rotating metal drum. The side of the foil next to the drum is smooth (the "shiny side") while the other side has a relatively rough surface (the "matte side"). Such foils usually have a weight of ½ to 5 ounces per square foot (153–1515 gms per square meter), which corresponds to a thickness of about 18 to 175 μm. The foil is laminated to a substrate, commonly, a reinforced epoxy sheet. An image of a circuit pattern is placed on the foil by exposing a photocurable material (resist) to curing radiation through a mask, following by removing the uncured resist with solvents. The areas of the foil which are not covered by the cured resist are removed by chemical etching, leaving the desired circuit pattern. It is important to the manufacturer that the etching be accurate so that the desired circuit pattern is obtained. In practice, etching is not perfect and compromises must be made to achieve the desired results. The precision of the etching process becomes more important as the circuit patterns become ever smaller. Consequently, both the foil manufacturer and the circuit board manufacturer are continually seeking methods of accurately producing the desired circuit patterns.

Since the exposed copper foil is attacked by chemical etching it will be appreciated that the accuracy with which the resist pattern reproduces the desired circuit pattern and the characteristics of the foil will affect the results obtained. As is discussed in U.S. Pat. No. 5,437,914, the grain structure of the copper foil has been found to affect the precision of the etching. Ideally, the etching proceeds directly down through the exposed copper. However, once it is below the resist on top of the foil, the etching material is not constrained and it can etch under the resist layer. Conventional practice has been to laminate the matte side of the foil to the substrate and then to etch from the exposed shiny side of the foil. However, the grain structure of the foil is finer and less oriented on the shiny side than on the matte side, which leads to horizontal etching under the resist. It was found that by laminating the foil with the shiny side down against the substrate, that much more accurate etching could be achieved, because the copper grains are elongated and oriented vertically near the matte side and less side or horizontal etching occurs. This means that the etching proceeds from the matte side toward the shiny side with less copper being removed in the horizontal direction under the resist. The resulting line of copper under the resist more nearly matches the rectangular cross-section which the circuit designer intended. The "etching factor", which indicates the width of the top of the circuit lines relative to the width of the bottom, is much improved.

Etch factor defines the precision with which a circuit line has been reproduced by chemical etching.

$$\text{Etch Factor} = \frac{2t}{W_2 - W_1}$$

where:

t is the height of the trace (the thickness of the foil)
$W_2$ is the width of the bottom of the trace
$W_1$ is the width of the top of the trace Since the widths of the top and bottom of the trace ideally are the same, that is, the trace should be rectangular in its cross-section, the etch factor should be infinity. In commercial practice, the etching factor should be as large as possible, preferably above 4.

In WO 94/21097, Polyclad Laminates also advocates laminating the shiny side of a copper foil to a substrate in order to provide advantages in subsequent lamination which flow from having the matte or rougher side of the foil exposed. However, they did not recognize the improved etching which results when etching starts at the matte side and proceeds toward the shiny side of the foil.

The shiny side of copper foil may be treated to deposit copper grains on the surface to roughen it and thus to facilitate lamination as discussed in the '914 patent. Treatment of copper foil with two additional deposits to improve adhesion is reported in U.S. Pat. No. 3,857,681 to Yates et al. A first layer of copper particles to improve bonding was followed by an encapsulating layer of copper to prevent the copper particles from being separated during subsequent processing steps. Subsequent electrodeposition of zinc, as also suggested by Yates et al. and by Luce et al. in U.S. Pat. No. 3,585,010, may be used to prevent staining of the printed circuit boards. Other protective metals may be applied, as Luce et al. have suggested. Chemical deposition of chromium oxide also may be used to protect the treated surface, as discussed in U.S. Pat. No. 5,057,193.

The matte side should be relatively smooth in order to assure that the grain size and orientation are suitable for etching. The roughness Rz should be about 4–7.5 μm. Although greater roughness will improve adhesion to the substrate, it may reduce the ability of the resist material to accurately define the edges of the circuit lines. In some cases, the surface can be sufficiently rough that resist "lock-in" occurs; this is the result of incomplete resist removal which interferes with etching and leads to electrical shorts when the full circuit pattern is insufficiently etched. Consequently, the matte surface should be rough enough to provide good adhesion, but not more.

While the lamination of the shiny side of copper foil to a substrate has been uncommon, probably because the matte side of the foil is rougher and has better adhesion to the substrate, the possibility was discussed by Adler in U.S. Pat. 4,997,516. The shiny side of the foil must have a roughening layer deposited on it to provide sufficient adhesion. Adler also commented on foils which have roughening layers provided on each side, so-called "double treated" foils. These are not preferred in the industry since the exposed side may have the toughening layer damaged during handling. Adler was concerned with another method of providing a toughening layer by chemical treatment. His method is a variation of "black oxide" treating, which may be used on either side of the foil during formation of multilayer circuit boards. In general, a circuit pattern is formed from a copper clad laminate, and then the exposed copper circuit is chemically treated to roughen its surface so that another insulating substrate can be laminated over the circuit. It will be appreciated that using a sequence of chemical treatments is not only cumbersome but introduces waste disposal problems with the chemicals used. Consequently, such chemical treatments are not desirable and should be avoided if possible.

When foils are laminated to a substrate with the shiny side down, and the roughness of the matte side is within the preferred range of 4–7.5 μm, it may be possible to laminate again without treatment of the matte side of the foil. However, the adhesion in some circumstances is marginal and it would be desirable to provide a foil which provides improved adhesion without the double treatment previously described and which does not need a black oxide treatment during the processing of multi-layer circuit boards. The present invention describes a foil having the desired properties, as will be seen in the detailed description below.

SUMMARY OF THE INVENTION

In one aspect, the invention is an electrolytically formed copper foil which has been electrolytically treated on the shiny side to form a roughening copper deposit and which has been electrolytically treated on the matte side to deposit micro nodules of a metal or alloy, preferably copper or a copper alloy, which do not increase the measured roughness, but nevertheless do increase adhesion to a substrate. Preferably, the shiny side has a copper deposit about 2 to 4.5 μm thick to produce a roughness Rz of 2 μm or greater. The matte side preferably will have a roughness Rz as made of about 4–7.5 m. The micro nodules of metal or alloy will have a size of around 0.5 μm. Other metals may be deposited as micro nodules if desired, for example, zinc, indium, tin, cobalt, brass, bronze and the like.

In another aspect, the invention comprises a copper clad laminate in which an electrolytically deposited copper foil is laminated on the shiny side to a first substrate, leaving the matte side exposed, and in which the matte side had been electrolytically treated to deposit sufficient micro nodules of metal or alloy, preferably copper or a copper alloy, to increase adhesion to a second substrate, but which does not increase the measured surface roughness Rz. The matte side will preferably have a measured roughness Rz of about 4–7.5 μm before and after such supplemental treatment.

In still another aspect, the invention comprises a method of treating an electrolytically deposited copper foil having a shiny side and a matte side in which the foil is passed through a bath comprising a soluble copper compound. The electrodeposition conditions and bath composition are adjusted to produce the micro nodules of copper or a copper alloy which are insufficient to increase the measured surface roughness, but sufficient to increase the adhesion to a substrate.

The invention also comprises a printed circuit board made with the improved copper foil.

In addition to the deposition of micro nodules of a metal or alloy, such as copper or a copper alloy, the foil of the invention may be protected by layers of electrodeposited zinc, indium, tin, nickel, cobalt, brass or bronze, preferably zinc. A final coating of chromium oxide and/or a silane may be applied.

DESCRIPTION OF THE PREFERRED EMBODIMENTS

MAKING THE FOIL

Figure 1:
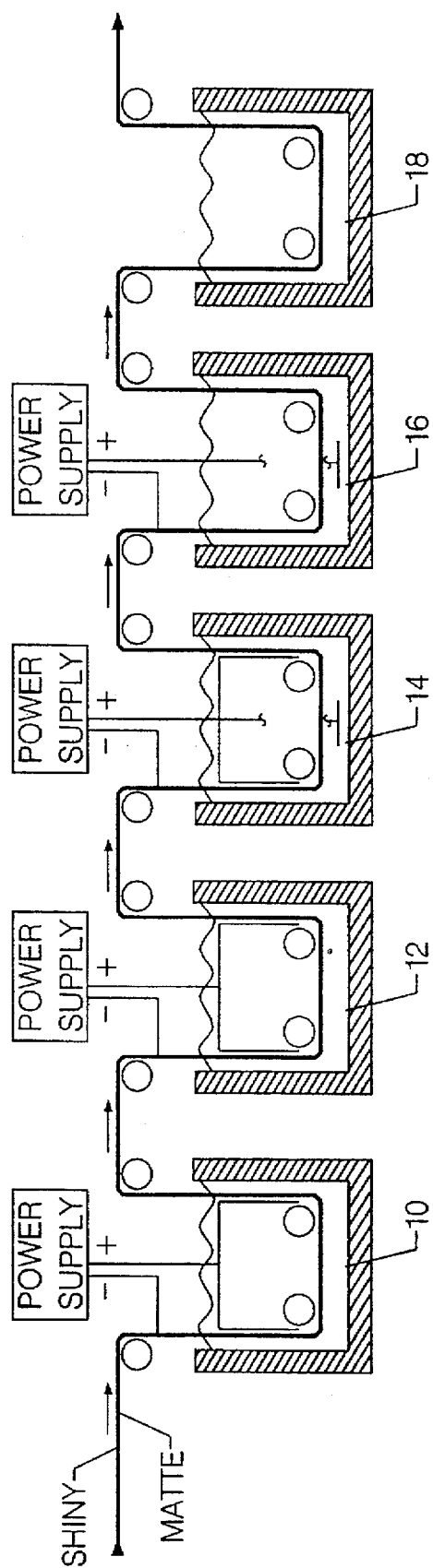
FIG. 1 is a schematic drawing illustrating the treating of a sheet of copper foil according to the invention.

The manufacturing of copper foil by electrolytic deposition is well known in the art and does not require detailed description here. See for example, Example I of U.S. Pat. No. 3,293,109. Copper is dissolved in sulfuric acid and then used in a solution which is prepared to facilitate electrodeposition. Typical solutions will include 70–105 g/L of copper as copper sulfate, 80–160 g/L of free sulfuric acid, at 40°–60° C.

Such solutions are brought into contact with a rotating metal drum, usually of stainless steel or titanium, which acts as a cathode and receives the copper as it is deposited from solution. The anode is generally constructed from a lead alloy. A cell voltage of about 5 to 10 volts is applied between the anode and the cathode to cause the copper to be deposited, while oxygen is evolved at the anode. As previously explained, the copper builds up a continuous film of copper on the drum of the desired thickness, say about 18 to 70 μm, which is removed, treated to enhance its bond strength, slit to the required width and finally wound in rolls for use in making electrical laminates.

TREATING THE FOIL

The average roughness, Rz, is commonly used in the industry to define the roughness of the copper foil surface. It is the mean of the individual roughness depths of five successive measuring lengths, as measured by profilometry. The depth is the vertical distance between the highest and lowest points within a given measuring length.

The average roughness Rz of the shiny side of the foil is much too small, say about 0.2–0.4 μm, so that it must be increased to provide adequate adhesion. Two techniques are commonly used, depending on whether the foil is to he immediately laminated or not. When the shiny side of the foil is exposed on an already laminated board, it may he given a "black oxide" treatment, in which the copper is pre-roughened by chemical micro aching and chemically treated to deposit a layer of copper oxide (which is black). See for example the discussion in the Adler '516 patent, in which he proposed that the copper oxide he reduced by further chemical treatment to leave fine copper whiskers attached to the surface of the foil. This artificial toughening of the foil is sufficient to provide adequate adhesion to a second substrate layer which is laminated to the treated shiny side surface.

As discussed in the U.S. Pat. No. 5,437,914 or in other earlier patents, such as Adler '516, Yates et al. in U.S. Pat. No. 3,857,681, Conley et al. U.S. Pat. No. 3,220,897, Luce et al. U.S. Pat. No. 3,293,109 and others, copper foil may be given an electrolytically deposited layer of rough copper in order to improve adhesion. The composition of the copper solutions are similar to those used in the original formation of the foil, but the copper concentration, solution temperature and current density are adjusted to produce a rougher surface. The rough copper layer may be encapsulated by a continuous layer of copper deposited over it. Zinc may be deposited electrolytically in a separate step to provide a "barrier layer" between the copper foil and the laminating resin substrate in order to prevent laminate staining which occurs when ingredients of the resin chemically react with copper. The electrodeposited copper and zinc may be protected by a chemically or electrochemically applied chromate layer. Finally, a coupling agent such as a silane may be applied.

It is unique to the process of the present invention that the electrolytically deposited copper is different on the two faces of the copper foil. A process for treating the foil is shown in FIG. 1. The copper deposit on the shiny side will have an average roughness P,z of about 2 to 4 μm after treatment in the first bath (10), while the matte side receives no deposit. The second bath (12) is optional, but preferably is used to apply an encapsulating layer of copper over the roughening deposit. In the third bath (14), a micro deposit of nodular copper is placed on both sides of the foil, although it is visible and has its effect on the matte side. The matte side will not have measurable increase in the roughness, Rz, but will exhibit improved adhesion because of the secondary roughness (i.e. the nodules) on the primary roughness, which can be seen in the photomicrographs of FIG. 2. The size of the nodules is estimated to be only about 0.5 μm. It is achieved by using an anode which is operated with a voltage differential of about 5–10 volts and a current density of about 80 to 500 mA/cm$^2$ for 1–5 seconds. Typically, the copper solution will be about 3 to 30 g/L copper as copper sulfate and 5–100 g/L of free sulfuric acid. The temperature will be about 20°–35° C. Instead of copper alone, alloys of copper such as copper-zinc, copper-arsenic, copper-tin, and the like could be substituted. Other metals could be used such as indium, tin, nickel, cobalt which also could be used as barrier layers. The fourth bath (16) is used to deposit a protective layer of zinc on both sides of the foil. Alternatively other protective metals could be applied such as indium, tin, nickel, cobalt, brass or bronze.

After the protective barrier layer has been deposited, a protective layer of chromium oxide may be chemically deposited in bath (18). Finally, a silane may be applied (not shown) to improve adhesion consistency.

The process just described can be carried out in a single pass, while conventional "double treat" foils must be made in two passes because of the high current density required to deposit heavy deposits of metal on both sides of the foil.

The copper for of the invention has several advantages over those previously available. As mentioned previously, if the matte side of the foil has a heavy treatment to improve roughness, such as has been implied in the prior art, all of the resist may not be removed before etching. If that occurs, the etching process is not as complete as desired. The relatively less rough mane surface of the invention avoids the resist "lock-in" problem. Secondly, a heavy deposit is not desirable because it increases the time necessary to complete the etching process. Consequently, the thinner deposits of the for of this invention increase the speed at which printed circuit boards can be produced. Finally, reduced roughness means that printed circuit boards can be made thinner, because the effective thickness of the foil includes the height of the surface roughness, which determines the thickness of the insulating substrate. Thus, both the for and the substrate can be thinner, permitting thinner multilayer printed circuit boards to be made.

EXAMPLE 1

A one ounce copper foil, about 35 μm thick ("drum foil") with a matte side roughness Rz of 6.5 microns and a shiny side roughness of 0.5 microns, is passed through a series of copper plating baths to produce a treatment on its shiny side as discussed above and in U.S. Pat. No. 5,437,914. Simultaneously, a micro nodular treatment is applied to the mane side of the foil from a solution of 5 g/L of copper as copper sulfate and 55 g/L free sulfuric acid at 25° C. The anode consists of a lead alloy sheet. The cell voltage applied between the anode and cathode (the foil) is 5 volts and a current density is 100 mA/cm sq. is applied for 3 seconds. A protective chromate layer is applied to both treated sides of the foil by immersion in a 2 g/L solution of chromic acid at pH 4 and 30° C. for 5 seconds. Finally both sides of the foil are immersed in a 5% solution of a silane at 25° C. and the foil is dried.

Figure 2:
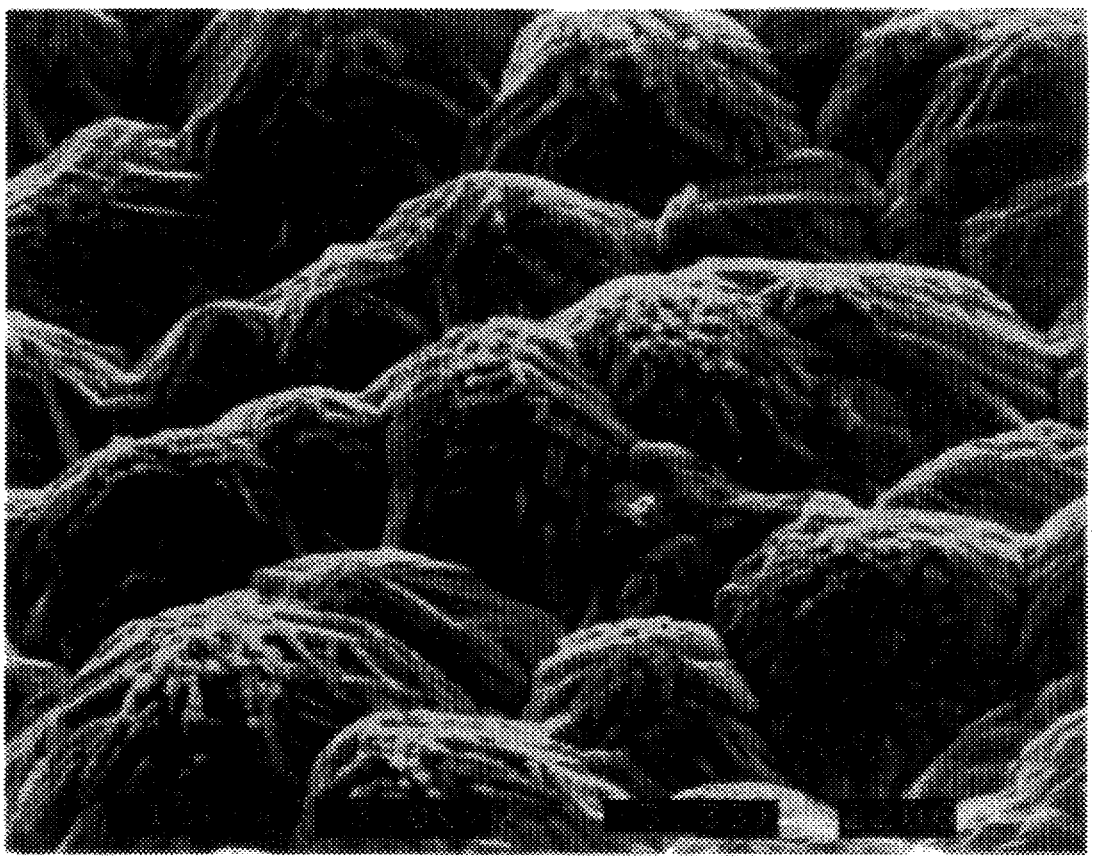
FIG. 2 is a photomicrograph of the matte side of copper foil treated to improve roughness according to the invention.

Examination of the foil shows that the deposit on the shiny side has a roughness (as measured by a contact profilometer such as a Perthometer M4P, Atlantech Sales Inc.), Rz of 3.5 μm while the surface of the matte side is still measured as 6.5 μm. However, microscopic examination shows that the matte side now contains the secondary roughness typical of the invention and as shown in FIG. 2.

EXAMPLE 2

A standard peel strength test was applied to the mane side of a copper foil after the treatments of Example 1 had been applied. For comparison, the matte side of the foil was tested as made, without the treatment of Example 1. The peel strength as made was found to be about 2.8 lb/in (50.1 g/mm) while the foil of Example 1 had a peel strength of about 10.2 lb/in (182.3 g/mm).

We claim:

1. In an electrolytically deposited copper foil having a shiny side on which a roughening deposit of copper has been placed to provide a roughness Rz of 2–4 μm and a matte side having a roughness Rz of about 4–7.5 μm, the improvement comprising a micro nodular deposit of metal or alloy on the matte side which does not increase the measured surface roughness Rz but which does increase adhesion to a substrate.

2. A copper foil of claim 1 wherein said matte side metal deposit comprises nodules of about 0.5 μm in size.

3. A copper foil of claim 1 wherein said nodular metal deposit is copper or a copper alloy.

4. A copper foil of claim 1 wherein said nodular metal deposit is a metal selected from the group consisting of zinc, indium, tin, cobalt, brass and bronze.

5. A copper foil of claim 1 further comprising a protective layer of at least one electrodeposited metal selected from the group consisting of zinc, indium, tin, cobalt, brass, and bronze.

6. A copper foil of claim 5 wherein said protective coating is zinc.

7. A copper foil of claim 5 further comprising a coating of chromium oxide and a silane.

8. A printed circuit board comprising the copper foil of claim 1.

9. A copper-clad laminate which consists essentially of an electrolytically deposited copper foil having a shiny side which is laminated to a first substrate and a matte side which is exposed, said matte side having a surface roughness of 4–7.5 μm and a supplemental micro nodular deposit of metal or alloy which does not increase the measured roughness Rz but which does increase adhesion to a second substrate.

10. A laminate of claim 9 wherein said supplemental micro nodular metal deposit comprises nodules of about 0.5 μm.

11. A laminate of claim 9 wherein said nodular metal deposit is copper or a copper alloy.

12. A laminate of claim 9 wherein said nodular metal deposit is a metal selected from the group consisting of zinc, indium, tin, cobalt, brass and bronze.

13. A laminate of claim 9 further comprising a protective layer of at least one electrodeposited metal selected from the group consisting of zinc, indium, tin, cobalt, brass, and bronze.

14. A laminate of claim 13 wherein said protective layer is zinc.

15. A laminate of claim 13 further comprising a coating of chromium oxide and a silane.

16. A laminate of claim 9 further comprising a second substrate laminated to said matte side in the absence of a black oxide treatment.

17. A method of depositing a micro nodular deposit on an electrolytically deposited copper foil having a shiny side and a matte side comprising passing said copper foil through an electroplating bath containing a solution comprising 3–30 g/L copper as copper sulfate and 5–100 g/L free $H_2SO_4$ at 20°–35° C. with a current density of 80–500 $mA/cm^2$ for 1–5 seconds, and thereby producing said micro nodular copper or copper alloy deposit which does not increase the measured surface roughness Rz but which does increase adhesion to a substrate.

18. The method of claim 17 wherein said micro nodular deposit is about 0.5 μm in size.

* * * * *